United States Patent
Kudela et al.

(10) Patent No.: US 8,438,990 B2
(45) Date of Patent: May 14, 2013

(54) MULTI-ELECTRODE PECVD SOURCE

(75) Inventors: Jozef Kudela, Sunnyvale, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 958 days.

(21) Appl. No.: 12/353,638

(22) Filed: Jan. 14, 2009

(65) Prior Publication Data

US 2010/0080933 A1    Apr. 1, 2010

Related U.S. Application Data

(60) Provisional application No. 61/101,559, filed on Sep. 30, 2008.

(51) Int. Cl.
*C23C 16/00* (2006.01)
*H01L 21/00* (2006.01)

(52) U.S. Cl.
USPC ............................ 118/723 E; 156/345.47

(58) Field of Classification Search ............... 118/723 E, 118/718; 156/345.43, 345.44, 345.45, 345.46, 156/345.47; 314/111.21
See application file for complete search history.

(56) References Cited

U.S. PATENT DOCUMENTS

| | | | | |
|---|---|---|---|---|
| 4,981,566 A | * | 1/1991 | Wurczinger | 204/192.13 |
| 5,907,221 A | * | 5/1999 | Sato et al. | 315/111.51 |
| 5,981,899 A | * | 11/1999 | Perrin et al. | 219/121.52 |
| 6,602,381 B1 | * | 8/2003 | Lenz | 156/345.1 |
| 6,642,661 B2 | * | 11/2003 | Strang | 315/111.21 |
| 2004/0168770 A1 | * | 9/2004 | Mitrovic et al. | 156/345.43 |
| 2004/0194709 A1 | * | 10/2004 | Yamagishi et al. | 118/723 E |
| 2006/0037701 A1 | * | 2/2006 | Koshiishi et al. | 156/345.44 |
| 2006/0254518 A1 | | 11/2006 | Ellingboe | |
| 2007/0158027 A1 | * | 7/2007 | Aoki et al. | 156/345.43 |
| 2007/0210032 A1 | | 9/2007 | Nishio | |
| 2008/0160776 A1 | | 7/2008 | Dhindsa et al. | |
| 2009/0102385 A1 | * | 4/2009 | Wi | 315/111.21 |
| 2009/0142511 A1 | * | 6/2009 | Haley et al. | 427/569 |

FOREIGN PATENT DOCUMENTS

| | | | |
|---|---|---|---|
| EP | 1796442 A | * | 6/2007 |
| JP | 2001049440 A | * | 2/2001 |
| JP | 2006054334 A | | 2/2006 |
| JP | 2007026781 A | | 2/2007 |
| JP | 2008204650 A | * | 9/2008 |

OTHER PUBLICATIONS

International Search Report and Written Opinion dated May 18, 2010 for International Application No. PCT/US2009/059101.

* cited by examiner

*Primary Examiner* — Sylvia R MacArthur
*Assistant Examiner* — Anna Crowell
(74) *Attorney, Agent, or Firm* — Patterson & Sheridan, LLP

(57) ABSTRACT

Embodiments of the present invention generally relate to methods and apparatus for plasma generation in plasma processes. The methods and apparatus generally include a plurality of electrodes. The electrodes are connected to a RF power source, which powers the electrodes out of phase from one another. Adjacent electrodes are electrically isolated from one another by electrically insulating members disposed between and coupled to the electrodes. Processing gas may be delivered and/or withdrawn through the electrodes and/or the electrically insulating members. The substrate may remain electrically floating because the plasma may be capacitively coupled to it through a differential RF source drive.

11 Claims, 7 Drawing Sheets

MULTI-ELECTRODE PECVD SOURCE

CROSS-REFERENCE TO RELATED APPLICATIONS

This application claims benefit of U.S. Provisional Patent Application Ser. No. 61/101,559 (APPM/013581), filed Sep. 30, 2008, which is herein incorporated by reference.

BACKGROUND OF THE INVENTION

1. Field of the Invention

Embodiments of the present invention generally relate to processing a moving substrate in a plasma environment.

2. Description of the Related Art

In the manufacture of integrated circuits and other electronic devices, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit and flat panel display fabrication with stringent thermal budgets, such as for very large scale or ultra-large scale integrated circuit (VLSI or ULSI) device fabrication.

One problem that has been encountered with plasma processing in integrated circuit fabrication is that devices may become damaged as a result of exposure to non-uniform plasma conditions, such as electric field gradients. For example, RF power in-rush occurring during plasma ignition may result in non-uniform plasma generation and distribution in the process region. The susceptibility or degree of device damage depends on the stage of device fabrication and the specific device design. For example, a substrate having a relatively large antenna ratio (e.g., area of metal interconnect to gate area) is more susceptible to arcing during plasma ignition than a substrate having a smaller antenna ratio. The substrate having a relatively large antenna ratio also tends to collect charges and amplify the charging effect, thereby increasing the susceptibility to plasma damage, such as arcing to the device being formed on the substrate. Devices containing an insulating or dielectric layer deposited on a substrate are susceptible to damage due to charges and/or potential gradients accumulating on the surface of the dielectric layer.

Additionally, the accumulation of charges or buildup of electrical gradients on the substrate may cause destructive currents to be induced in portions of the metalized material. The induced current often results in arcing between dielectric layers and/or to the processing environment (e.g., a system component). Arcing may not only lead to device failure and low product yield, but may also damage components of the processing system, thereby shortening the useful life of system components. The damaged system components may cause process variation or contribute to particle generation, both of which may further reduce product yield. As the feature size of devices becomes smaller and dielectric layers become thinner, prevention of unstable and/or non-uniform plasma distribution becomes increasingly important not only for ensuring device electrical performance and product yield, but also for extending the service life of system components and managing system operating costs.

Therefore, there is a need for an improved method and apparatus for plasma processing.

SUMMARY OF THE INVENTION

Embodiments of the present invention generally relate to methods and apparatus for plasma generation in plasma processes. The methods and apparatus generally include a plurality of electrodes. The electrodes are connected to an RF power source, which powers the electrodes out of phase from one another. Adjacent electrodes are electrically isolated from one another by electrically insulating members disposed between and coupled to the electrodes. Processing gas may be delivered and/or withdrawn through the electrodes and/or the electrically insulating members. The substrate may remain electrically floating because the plasma may be capacitively coupled to it through a differential RF source drive.

In one embodiment, an apparatus includes a plurality of electrodes. The plurality of electrodes are driven by an RF power source such that adjacent electrodes are powered out of phase from one another. The electrodes are electrically isolated from one another by at least one electrically insulating member disposed between the electrodes. The at least one electrically insulating member has a plenum formed at least partially therein and at least one opening facing a movably disposed susceptor. The electrically insulating member has a length greater than a width, and is positioned so that the length is perpendicular to the direction in which the susceptor is movable.

In another embodiment, an apparatus includes a plurality of electrodes arranged in a planar configuration and an electrically floating susceptor positioned opposite the plurality of electrodes. At least one RF power source is coupled to the plurality of electrodes such that adjacent electrodes are driven in opposite phases. One or more electrically insulating members are coupled to and disposed between adjacent electrodes of the plurality of electrodes, and each of the electrically insulating members has a length substantially equal to the length of the adjacent electrodes.

In another embodiment, a method for processing a substrate includes flowing an RF current to a plurality of electrodes within a chamber such that adjacent electrodes are powered out of phase from each other. A process gas is flown into the chamber through a first electrically insulating member disposed between a first pair of adjacent electrodes, and a plasma is generated. A substrate is moved past the plurality of electrodes on an electrically floating susceptor located opposite the plurality of electrodes. A layer is deposited on the substrate, and process gas is evacuated from the chamber through gas passages disposed within a second electrically insulating member located between a second pair of adjacent electrodes.

In another embodiment, a method for processing a substrate includes flowing a RF current to a plurality of electrodes within a chamber such that adjacent electrodes are powered out of phase from each other. A process gas flows into the chamber through openings formed through the electrodes, and a plasma is generated. A substrate is moved past the plurality of electrodes on an electrically floating susceptor located opposite the plurality of electrodes. A layer is deposited on the substrate, and process gas is evacuated from the chamber through gas passages disposed within a second electrically insulating member located between a second pair of adjacent electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods and apparatus for plasma generation in a plasma processes. The methods and apparatus generally include a plurality of electrodes. The electrodes are connected to an RF power source, which powers the electrodes out of phase from one another. Out of phase as used herein shall be understood to mean out of phase or close to out of phase. Adjacent electrodes are electrically isolated from one another by electrically insulating members disposed between and coupled to the electrodes. Processing gas may be delivered and/or withdrawn through the electrodes and/or the electrically insulating members. The substrate may remain electrically floating because plasma may be capacitively coupled to it through a differential RF source drive.

Embodiments of the invention will be described below in reference to a multi-electrode plasma deposition system available from AKT America, Inc., a wholly owned subsidiary of Applied Materials, Inc., Santa Clara, Calif. It is to be understood that the invention may have utility in other systems, including those sold by other manufacturers. Embodiments of the present invention are applicable for processing numerous types of substrates such as roll-to-roll substrates, solar panel substrates, flat panel display (FPD) substrates, polygonal substrates, organic light emitting display (OLED) substrates and semiconductor substrates.

Figure 1A:
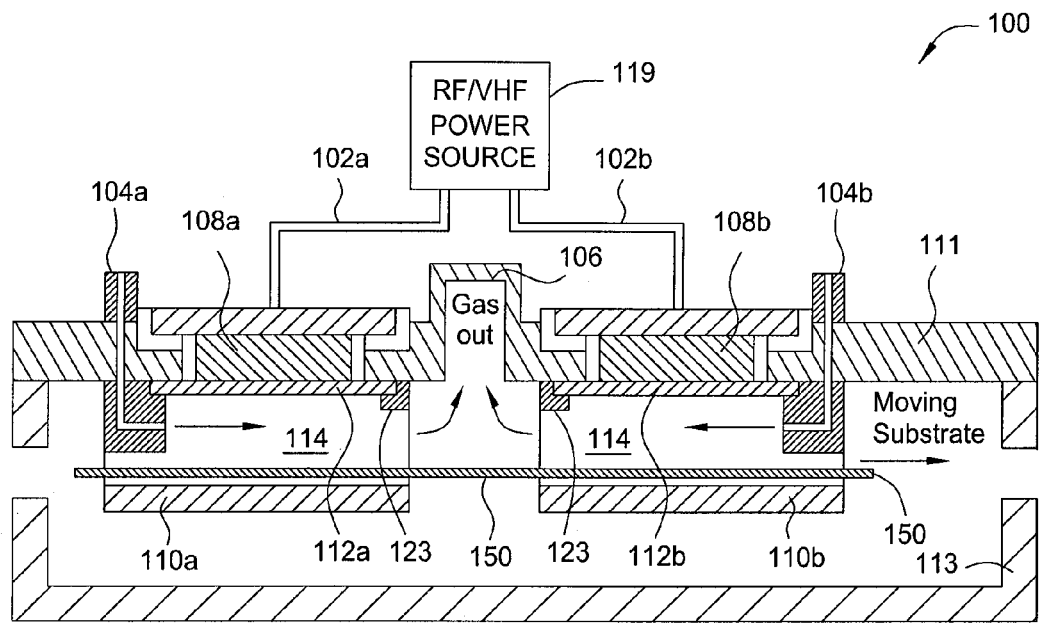
FIG. 1A is a schematic sectional view of a multi-electrode processing apparatus.

FIG. 1A is a schematic sectional view of a multi-electrode processing apparatus. The plasma processing apparatus 100 is coupled to a chamber lid, and may be utilized in processes such as deposition or etching. In FIG. 1A, the chamber shown is a PECVD chamber, arranged in a twin-electrode, planar configuration utilizing capacitively-coupled plasma.

Plasma processing apparatus 100 is coupled to chamber lid 111. The chamber lid 111 is coupled to the chamber body 113, as depicted in FIG. 1A. Susceptors 110a and 110b may extend above the floor of the chamber body 113. A substrate 150 is moved over the susceptors 110a and 110b.

Positioned opposite the susceptors 110a and 110b and coupled to the chamber lid 111 are electrodes 108a and 108b. It is to be understood that while two electrodes 108a and 108b are shown, more electrodes may be present. Centrally disposed within the chamber lid 111 and located between electrodes 108a and 108b is member 106 acting as a gas outlet. Members 104a and 104b, acting as gas inlets, are disposed within the chamber lid 111 and positioned between the chamber body 113 and respective electrodes 108a and 108b.

Electrodes 108a and 108b are coupled to RF source 119 by couplings 102a and 102b. In the embodiment of FIG. 1A, the electrodes 108a and 108b comprise plate type electrodes having no gas passages formed therethrough. Alternatively, the electrodes 108a and 108b may comprise plate electrodes having gas passages therethrough to permit the processing gas to enter and/or exit through the electrodes 108a and 108b. In another embodiment, the electrodes 108a and 108b may comprise sputtering targets or other conductive material. For example, in the embodiment of FIG. 1A, the electrodes 108a and 108b may comprise aluminum. Electrodes 108a and 108b have a substantially planar surface area facing the substrate 150. Alternatively, one or more electrodes may have a concave surface facing the substrate 150. Electrodes 108a and 108b have a surface area within a range from about 1500 square centimeters to about 3000 square centimeters. In one embodiment, the surface area may be between about 2200 square centimeters to about 2400 square centimeters.

In the embodiment of FIG. 1A, electrodes 108a and 108b are covered by electrode covers 112a and 112b. In another embodiment, the electrode covers 112a and 112b may comprise an electrically insulating material. Additionally or alternatively, the electrode covers 112a and 112b may comprise glass or quartz. The electrode covers 112a and 112b can be clamped into place by clamps 123 to protect the electrodes 108a and 108b from damage caused by plasma generation in the process chamber. The electrode covers 112a and 112b are substantially the same size as the electrode area, or slightly larger than the electrode area. After multiple depositions, for instance 10, 50, or 100 depositions, the electrode covers 112a and 112b can be unclamped and removed for cleaning. The electrode covers 112a and 112b can be wet cleaned using NF$_3$ and then reused, or new electrode covers can replace the used electrode covers 112a and 112b.

Gas inlet members 104a and 104b are located near the chamber body 113, and are positioned such that respective electrode 108a or 108b is located between a gas inlet member 104a/104b and gas outlet member 106. Gas inlet members 104a and 104b are preferably constructed of the same material as chamber lid 111. For example, gas inlet members 104a and 104b may comprise gas passages formed within the chamber lid 111. Alternatively, piping or tubing may be used to provide gas passage. Gas outlet member 106 comprises a body having a plenum formed at least partially therein. The body is preferably made of an electrically insulating material such as ceramic so that the electrodes 108a and 108b may be electrically isolated from one another.

Process gas flows into the process chamber through members 104a and 104b and exits the process chamber through gas outlet member 106. The process gas flows in the direction indicated by the flow arrows in FIG. 1A. Alternatively, the process gas may flow in the opposite direction (e.g., the process gas enters the chamber through member 106, and exits the chamber at the sides through members 104a and 104b). The gas may have a laminar flow in region 114, which helps to increase the consistency of processing effects.

While susceptors 110a and 110b are shown as multiple susceptors, it is to be understood that susceptors 110a and 110b may comprise one solid unified susceptor, as indicated by the dashed lines in FIG. 1A. The susceptors 110a and 110b are static relative to the substrate 150 which moves past the electrodes 108a and 108b. Alternatively, the susceptors 110a and 110b may be movable relative to the electrodes 108a and 108b such that movement of the substrate 150 is facilitated by the movement of the susceptors 110a and 110b. For example, the susceptors 110a and 110b may be on rollers such that the susceptor is capable of rolling past the electrodes 108a and 108b while traveling within the chamber.

In one embodiment, the susceptors 110a and 110b may have one or more brackets 128 (See FIG. 1B) that couple the susceptors 110a and 110b electrically with the power source 119. The brackets 128 permit the RF current to flow from the electrode, through the generated plasma, along the susceptor 110a and 110b, and along the bracket 128 back to the power source 119. Thus, the susceptors 110a and 110b may form a portion of the RF return path.

In another embodiment, the electrodes 108a and 108b may be operated out of phase with each other such that the electrodes 108a and 108b operate in a push/pull arrangement. One electrode 108a or 108b would be driven in a first phase and, in essence, push the RF current to the plasma and the other electrode 108a or 108b would be driven out of phase and thus provide the RF return path for the current. The RF current would travel from one electrode 108a or 108b, through the plasma, and back through the out of phase electrode 108a or 108b to the power source 119. For example, when electrode 108a is driven out of phase with electrode 108b, electrode 108b acts as the return path for the RF current and thus, the brackets 128 become unnecessary. Out of phase as used herein refers to about 180 degrees out of phase, unless specifically noted otherwise.

When the electrodes 108a and 108b are driven symmetrically, capacitively-coupled plasma is generated within the chamber. When power is applied through couplings 102a and 102b to electrodes 108a and 108b, plasma is ignited within the chamber in area 114. The couplings 102a and 102b can be coupled to an RF drive. RF as used herein encompasses and includes the RF subset of VHF, and recitation of RF herein shall be understood to include both RF and VHF ranges. Suitable RF drives include frequencies such as 13.56 MHz, 27 MHz, 30 MHz., 40 MHz, 60 MHz, 80 MHz or 100 MHz.

One advantage of the symmetric drive is that it is much easier to return the RF current to the source as compared to a plurality of electrodes driven in the same phase. Because it becomes increasingly difficult for the RF current to return to the source without forming a parasitic plasma or arcing when using higher frequency generators, it is advantageous to "pulling" the current through the system using a push-pull setup. For example, RF current can be returned to source through oppositely-phased electrode 108b. If the electrodes 108a and 108b are not capacitively-coupled by plasma, the current may need to travel through a conductive surface behind the substrate, such as the susceptor 110a or 110b, or through the substrate itself if the substrate is conductive in order to reach electrode 108b. When the substrate itself is conductive, the susceptor may be unnecessary. Additionally or alternatively, if the plasma within the chamber is unified, the plasma itself provides a path for current travel to return to source. Therefore, neither a susceptor nor a conductive substrate would be necessary.

In the embodiment of FIG. 1A, a substrate 150 is used that is conductive in a chamber having divided plasma. The RF current form RF power source 119 travels through coupling 102a into electrode 108a. The current is capacitively coupled through plasma in a first region 114 to substrate 150. The current travels along substrate 150, back through the capacitively coupled plasma in a second region 114 to electrode 108b. The current then returns to the power source 119 through coupling 102b.

In another embodiment, the substrate 150 may not be conductive, and the susceptors 110a and 110b may be a unified susceptor. In such embodiments, the RF current travels from RF power source 119 through coupling 102a to electrode 108a. The current is then capacitively coupled to the unified susceptor through the substrate 150. The current travels through the susceptor, and then travels back through the capacitively coupled plasma to electrode 108b, where the current can return to the power source 119.

Alternatively, the plasma generated by plasma processing apparatus 100 may be a single, unified plasma within the chamber. When the unified plasma is generated within the chamber, the current does not need to travel through the substrate 150 or susceptors 110a or 110b to return to source. Instead, current from RF source 119 travels through coupling 102a to electrode 108a. The current is then capacitively-coupled through plasma within the chamber to electrode 108b, and travels through coupling 102b to return to the power source 119.

In another alternative, the plasma generated by plasma processing apparatus 100 may be a single, unified plasma within the chamber and the susceptor may be grounded. The current from RF source 119 may return to source through capacitively-coupled plasma by means of an oppositely-phased electrode 108b, as well as through the bracket 128 coupled to the susceptor 110a or 110b. However, the current returning through the susceptor 110a or 110b is less significant, since a portion of the current is returning through oppositely-phased electrode 110b.

Figure 1B:
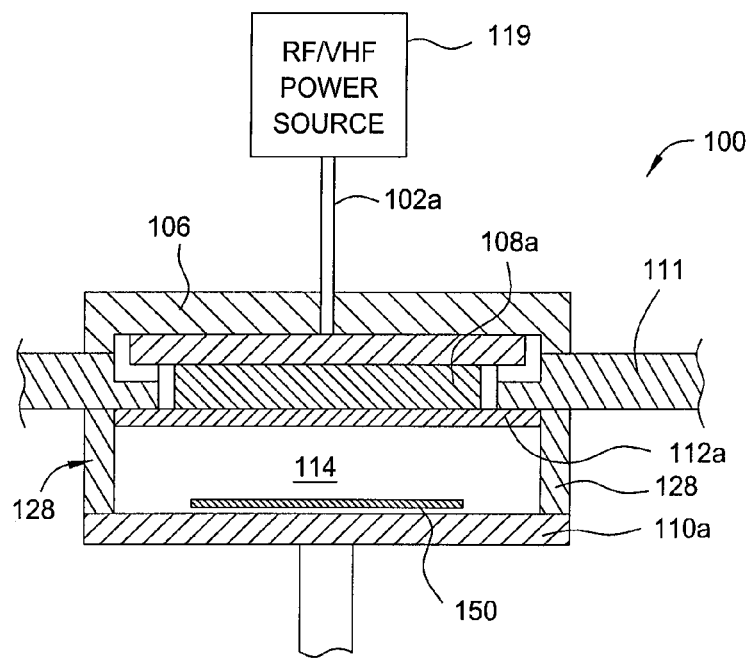
FIG. 1B is a schematic sectional view of the multi-electrode processing apparatus of FIG. 1A rotated 90 degrees.

FIG. 1B is a schematic sectional view of the multi-electrode processing apparatus of FIG. 1A rotated 90 degrees. FIG. 1B shows the brackets 128, which are not visible in FIG. 1A. In the embodiment of FIG. 1B, the brackets 128 comprise aluminum. The brackets 128 are disposed between susceptor 110a and chamber lid 111. Additionally, the brackets 128 may also be disposed between susceptor 110b (not shown) and chamber lid 111. The brackets 128 may provide the current return path to the RF power source 119. Current flows from RF power source 119, through couplings 102a to electrode 108a. The current then flows through the plasma and along the susceptors 110a and 110b and then along bracket 128 back to the power source 119. The impedance of capacitively-coupled plasma may be more advantageous for processing than that of the brackets 128, and therefore the rate of RF return is quicker when using capacitively-coupled plasma.

FIGS. 1A and 1B utilize electrode covers 112a and 112b. The use of glass electrode covers 112a and 112b not only offers protection to the electrodes, but also provides high secondary electron emissions when plasma is generated within the chamber. The electrode covers 112a and 112b can comprise any suitable glass compound, such as quartz.

The electrode covers 112a and 112b may be clamped into place by clamps 123. Since the electrode covers 112a and 112b protect electrodes 108a and 108b during plasma processing, an in-situ clean of electrodes 108a and 108b may be unnecessary. Instead, the electrode covers 112a and 112b can be unclamped and replaced, thereby increasing process downtime.

Additionally, the electrode covers 112a and 112b emit electrons when struck by electrons present in the plasma. Preferably, glass electrode covers 112a and 112b are made of material which includes quartz, due to the high secondary electron emission of quartz in comparison to other types of glass.

The secondary electron emission by the electrode covers 112a and 112b induces the plasma present in the processing chamber to transition from an alpha state to a gamma state, for example, by ionizing more plasma within the chamber. Plasma can be induced into gamma state without the use of electrode covers 112a and 112b, however, doing so requires a much greater amount of energy than when the electrode covers 112a and 112b are used.

Gamma state plasma has multiple advantages. In alpha state, plasma has a lower density and typically is located away from a substrate surface. However, by transitioning to a gamma state, the plasma density is increased, and the plasma is located more closely to the substrate surface. The effects of gamma state plasma increase the processing efficiency of the plasma as compared to alpha state plasma. Also, gamma state plasma is more energy efficient. When providing power in alpha state, higher voltages are required because approximately 30 percent of the power is absorbed in the matchbox. The voltage loss when processing in gamma state is noticeably less.

Figure 2:
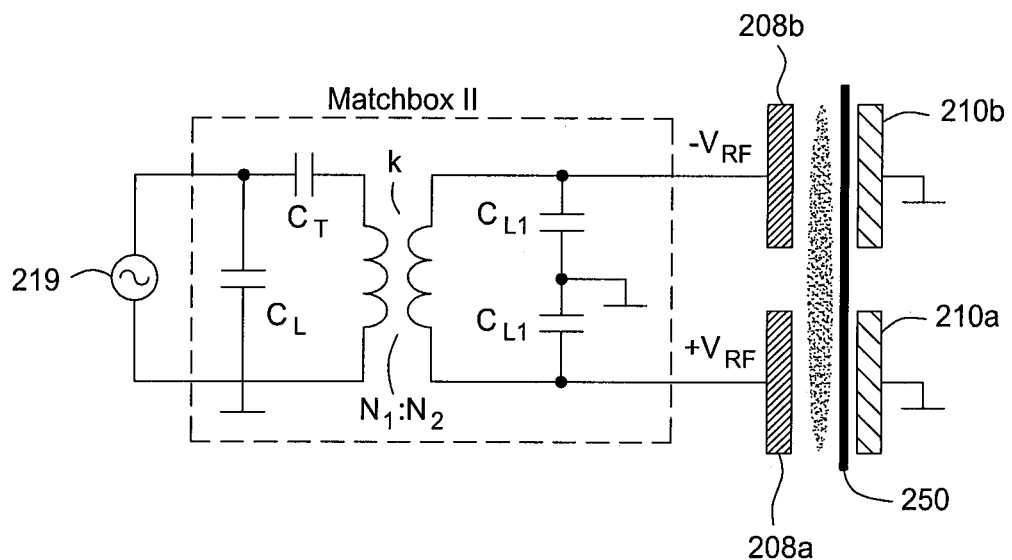
FIG. 2 is a schematic view of another embodiment of a circuit used in powering a multi-electrode processing apparatus.

FIG. 2 is a schematic view of another embodiment of a circuit used in powering a multi-electrode processing apparatus. The circuit is designed to power a multi-electrode processing apparatus in a push-pull mode, such that electrodes 208a and 208b are powered by two RF feeds in opposite phases. In the embodiment of FIG. 2, RF drive and matching is performed in conjunction with a transformer.

The embodiment of FIG. 2 includes an RF power source 219 and a single matchbox. Electrodes 208a and 208b are coupled to the matchbox and are a disposed opposite of susceptors 210a and 210b. Alternatively, susceptors 210a and 210b can be a unified susceptor. Substrate 250 is moved relative to electrodes 208a and 208b. Suitable RF drives include frequencies such as 13.56 MHz, 27 MHz, 30 MHz, 40 MHz, 60 MHz, 80 MHz or 100 MHz. RF power source 219 may generate power within a range from about 250 W to about 3000 W. For example, the power may be within a range from about 1000 W to about 2000 W.

The matchbox includes a tuning capacitor $C_T$, a transformer k, a load capacitor $C_L$, and shunt capacitors $C_{L1}$ and $C_{L2}$. The tuning capacitor $C_T$ and the load capacitor $C_L$ are disposed between the RF source and the transformer k. Shunt capacitors $C_{L1}$ and $C_{L2}$ are disposed between the transformer k and electrodes 208a and 208b. Shunt capacitors $C_{L1}$ and $C_{L2}$ are used to suppress current fluctuations within the electrical system. Also, the placement of shunt capacitors $C_{L1}$ and $C_{L2}$ allows the matching box to lower the impedance of the load. Additionally, the $N_1:N_2$ ratio of the transformer k can be adjusted such that load capacitor $C_L$ is not necessary.

Figure 3:
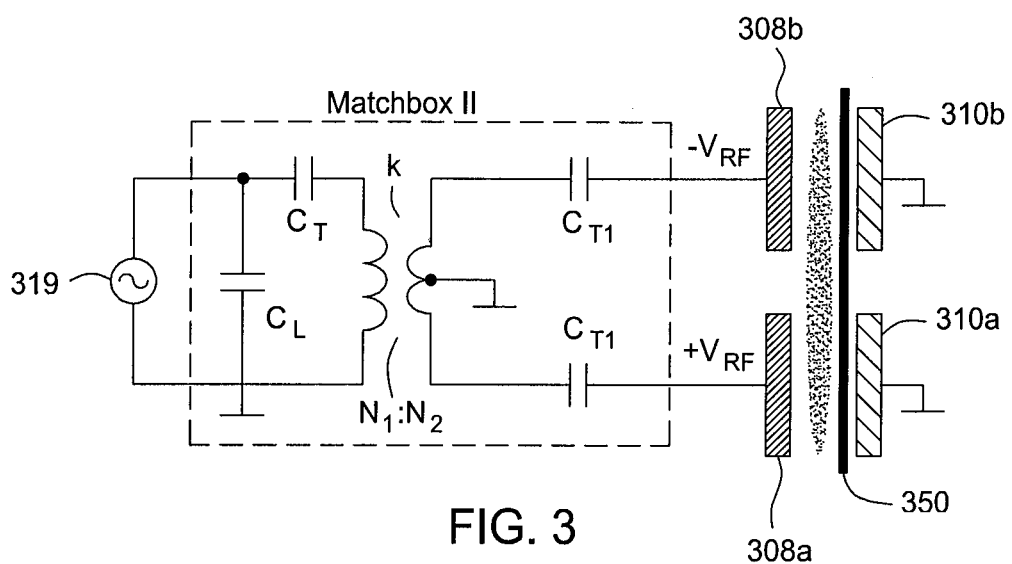
FIG. 3 is a schematic view of another embodiment of a circuit used in powering a multi-electrode processing apparatus.

FIG. 3 is a schematic view of another embodiment of a circuit used in powering a multi-electrode processing apparatus. The circuit is designed to power a multi-electrode processing apparatus in a push-pull mode, such that electrodes 308a and 308b are powered by two RF feeds in opposite phases. In the embodiment of FIG. 3, RF drive and matching is performed in conjunction with a transformer.

The embodiment of FIG. 3 includes an RF power source 319 and a single matchbox coupled to electrodes 308a and 308b. Electrodes 308a and 308b are disposed opposite of susceptors 310a and 310b. Alternatively, susceptors 310a and 310b can be a unified susceptor. Substrate 350 is moved relative to electrodes 308a and 308b. Suitable RF drives include frequencies such as 13.56 MHz, 27 MHz, 30 MHz., 40 MHz, 60 MHz, 80 MHz or 100 MHz. RF power source 319 may generate power within a range from about 250 W to about 3000 W. For example, the power may be within a range from about 1000 W to about 2000 W.

The matchbox includes a tuning capacitor $C_T$, a transformer k, a load capacitor $C_L$, and additional series tuning capacitors $C_{T1}$ and $C_{T2}$. The tuning capacitor $C_T$ and the load capacitor $C_L$ are disposed between the RF source and the transformer k. Tuning capacitors $C_{T1}$ and $C_{T2}$ are disposed between the transformer k and electrodes 308a and 308b. Tuning capacitors $C_{T1}$ and $C_{T2}$ allow the matching box to increase the impedance of the load. Additionally, the $N_1:N_2$ ratio of the transformer k can be adjusted such that load capacitor $C_L$ is not necessary.

Figure 4:
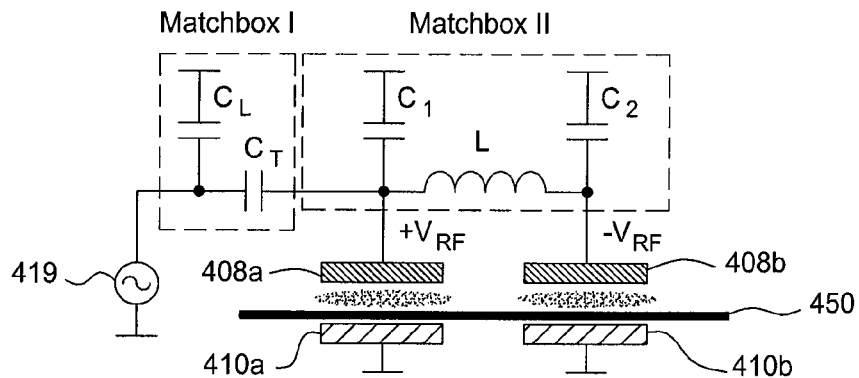
FIG. 4 is a schematic view of one embodiment of a circuit used in powering a multi-electrode processing apparatus.

FIG. 4 is a schematic view of one embodiment of a circuit used in powering a multi-electrode processing apparatus. The circuit is designed to power a multi-electrode processing apparatus in a push-pull mode. In the embodiment of FIG. 4, RF drive and matching is performed without the use of a transformer.

The embodiment of FIG. 4 includes a RF power source 419, a first matchbox and a second matchbox. The second matchbox is connected directly to electrodes 408a and 408b, which are disposed across from susceptors 410a and 410b. The first matchbox is either a standard (automatic) matching box operating with a fixed-frequency RF power source 419, or alternatively it is a fixed match connected to a variable-frequency power source 419. The second matchbox is a fixed matchbox.

Suitable RF drives include frequencies such as 13.56 MHz, 27 MHz, 30 MHz., 40 MHz, 60 MHz, 80 MHz or 100 MHz. RF power source 419 may generate power within a range from about 250 W to about 3000 W. For example, the power may be within a range from about 1000 W to about 2000 W.

The first matchbox includes a load capacitor $C_L$ and a tuning capacitor $C_T$. The load capacitor $C_L$ assists in providing a constant power level from the RF power source 419 to the electrodes 408a and 408b. The tuning capacitor $C_T$ is used to set the resonance frequency in the second matchbox, or is used for impedance matching. The second matchbox is a fixed matchbox and includes capacitors $C_1$ and $C_2$, as well as inductor L. The inductor L is disposed between the capacitors $C_1$ and $C_2$, and the electrodes 408a and 408b.

In the embodiment of FIG. 4, electrodes 408a and 408b are symmetrically driven by a single common RF power source 419. Voltages are lower at the electrodes 408a and 408b than they are at the susceptors 410a and 410b. Therefore, the push-pull setup of symmetric drive is more efficient, and requires a smaller voltage to power the plasma processing apparatus in a symmetric drive mode as compared to a parallel drive mode. For example, approximately half the voltage is required. In a parallel drive system, one generator and one matchbox may be needed to power each pair of electrodes. However, when electrodes are symmetrically driven, one generator and matchbox can power all the electrodes of the plasma processing apparatus.

Figure 5:
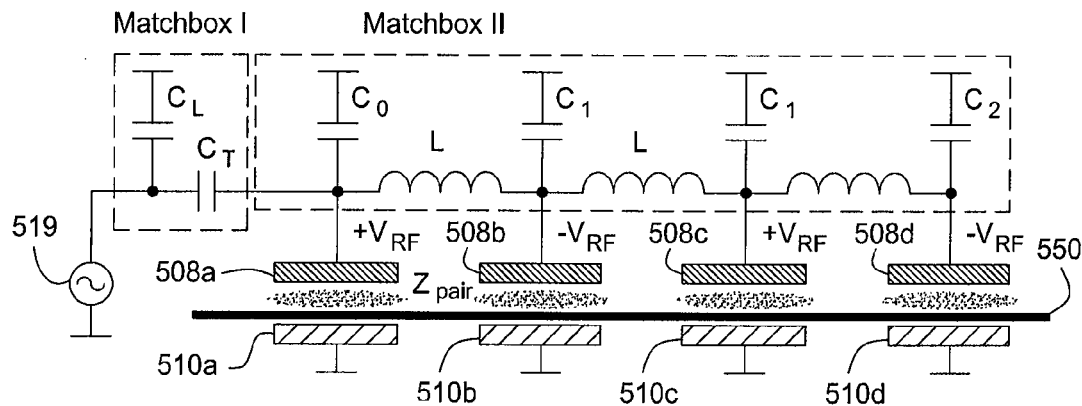
FIG. 5 is a schematic view of another embodiment of a circuit used in powering a multi-electrode processing apparatus.

FIG. 5 is a schematic view of another embodiment of a circuit used in powering a multi-electrode processing apparatus. The circuit is designed to power a multi-electrode processing apparatus in a push-pull mode, such that adjacent electrodes 508a, 508b, 508c and 508d are powered in opposite phases. In the embodiment of FIG. 5, RF drive and matching is performed without a transformer.

The embodiment of FIG. 5 includes an RF power source 519 and a first and second matchbox. The RF power source 519 is coupled to the first matchbox, and the first matchbox is coupled to the second matchbox. The first matchbox is either a standard (automatic) matching box operating with a fixed-frequency RF power source 519, or alternatively it is a fixed match connected to a variable-frequency generator. The second matchbox is a fixed matchbox. Electrodes 508a, 508b, 508c and 508d are coupled to the second matchbox and are a disposed opposite of susceptors 510a, 510b, 510c and 510d. Alternatively, susceptors 510a, 510b, 510c and 510d can be a unified susceptor. Substrate 550 is moved relative to electrodes 510a, 510b, 510c and 510d. Suitable RF drives include frequencies such as 13.56 MHz, 27 MHz, 30 MHz., 40 MHz, 60 MHz, 80 MHz or 100 MHz. RF power source 519 may generate power within a range from about 250 W to about 3000 W. For example, the power may be within a range from about 1000 W to about 2000 W.

The first matchbox includes a load capacitor $C_L$ and a tuning capacitor $C_T$. The load capacitor $C_L$ assists in providing a constant power level from the generator to the electrodes 508a, 508b, 508c and 508d. The tuning capacitor $C_T$ is used to set the resonance frequency in the second matchbox, or is used for impedance matching.

The second matchbox is a fixed matchbox and includes shunt capacitors $C_0$, $C_1$ and $C_2$, as well as inductors L. The inductor L is disposed between the shunt capacitors $C_0$, $C_1$ and $C_2$, and the electrodes 508a, 508b, 508c and 508d. Shunt capacitors $C_0$, $C_1$ and $C_2$ are used to suppress current fluctuations within the electrical system. Also, the placement of shunt capacitors $C_o$, $C_1$ and $C_2$ allows the matching box to lower the impedance of the load. Neighboring electrodes are powered with opposite-phased RF signals from a resonant LC line, which is may be constructed from coaxial cable. The resonant LC line has voltage maximums at the coil ends and voltage nodes in the middle of the coils, similar to "standing waves" in transmission lines.

Figure 6:
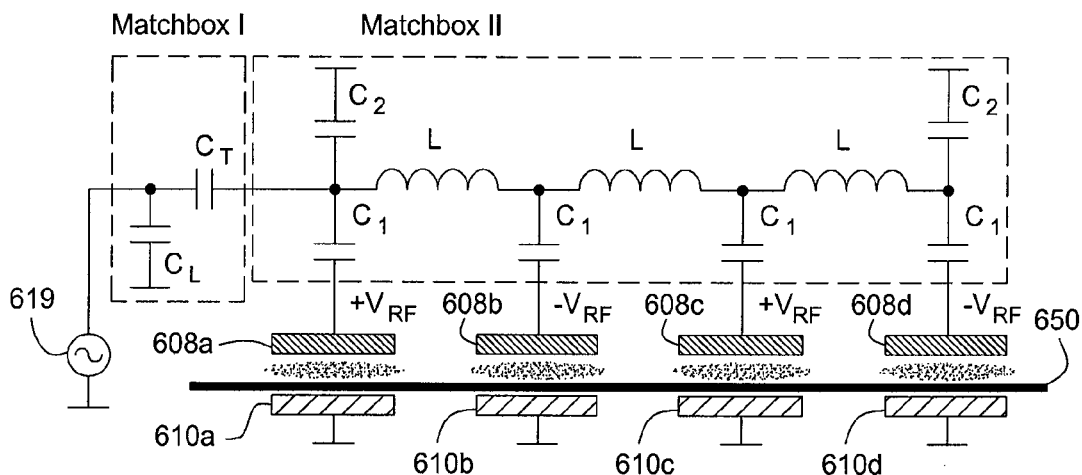
FIG. 6 is a schematic view of another embodiment of a circuit used in powering a multi-electrode processing apparatus.

FIG. 6 is a schematic view of another embodiment of a circuit used in powering a multi-electrode processing apparatus. The circuit is designed to power a multi-electrode processing apparatus in a push-pull mode, such that electrodes 608a, 608b, 608c and 608d are powered in opposite phases. In the embodiment of FIG. 6, RF drive and matching is performed without a transformer.

The embodiment of FIG. 6 includes an RF power source 619 and a first and second matchbox. The RF power source 619 is coupled to the first matchbox, and the first matchbox is coupled to the second matchbox. The first matchbox is either a standard (automatic) matching box operating with a fixed-frequency RF power source 619, or alternatively is a fixed match connected to a variable-frequency generator. The second matchbox is a fixed matchbox. Electrodes 608a, 608b, 608c and 608d are coupled to the second matchbox and are a disposed opposite of susceptors 610a, 610b, 610c and 610d. Alternatively, susceptors 610a, 610b, 610c and 610d can be a unified susceptor. Substrate 650 is moved relative to electrodes 610a, 610b, 610c and 610d. Suitable RF drives include frequencies such as 13.56 MHz, 27 MHz, 30 MHz., 40 MHz, 60 MHz, 80 MHz or 100 MHz. RF power source 619 may generate power within a range from about 250 W to about 3000 W. For example, the power may be within a range from about 1000 W to about 2000 W.

The first matchbox includes a load capacitor $C_L$ and a tuning capacitor $C_T$. The load capacitor $C_L$ assists in providing a constant power level from the RF power source 619 to the electrodes 608a, 608b, 608c and 608d. The tuning capacitor $C_T$ is used to set the resonance frequency in the second matchbox, or is used for impedance matching.

The second matchbox is a fixed matchbox and includes series capacitors $C_1$ and shunt capacitors $C_2$, as well as inductors L. Shunt capacitors $C_2$ are used to suppress current fluctuations within the electrical system. The series capacitors $C_1$ are disposed between the inductors L, and the electrodes 608a, 608b, 608c and 608d. Series capacitors $C_1$ allow the matching box to increase the impedance of the load. Neighboring electrodes are powered with opposite-phased RF signals from a resonant LC line, which may be constructed from coaxial cable. The resonant LC line has voltage maximums at the coil ends and voltage nodes in the middle of the coils; similar to "standing waves" in transmission lines.

Figure 7:
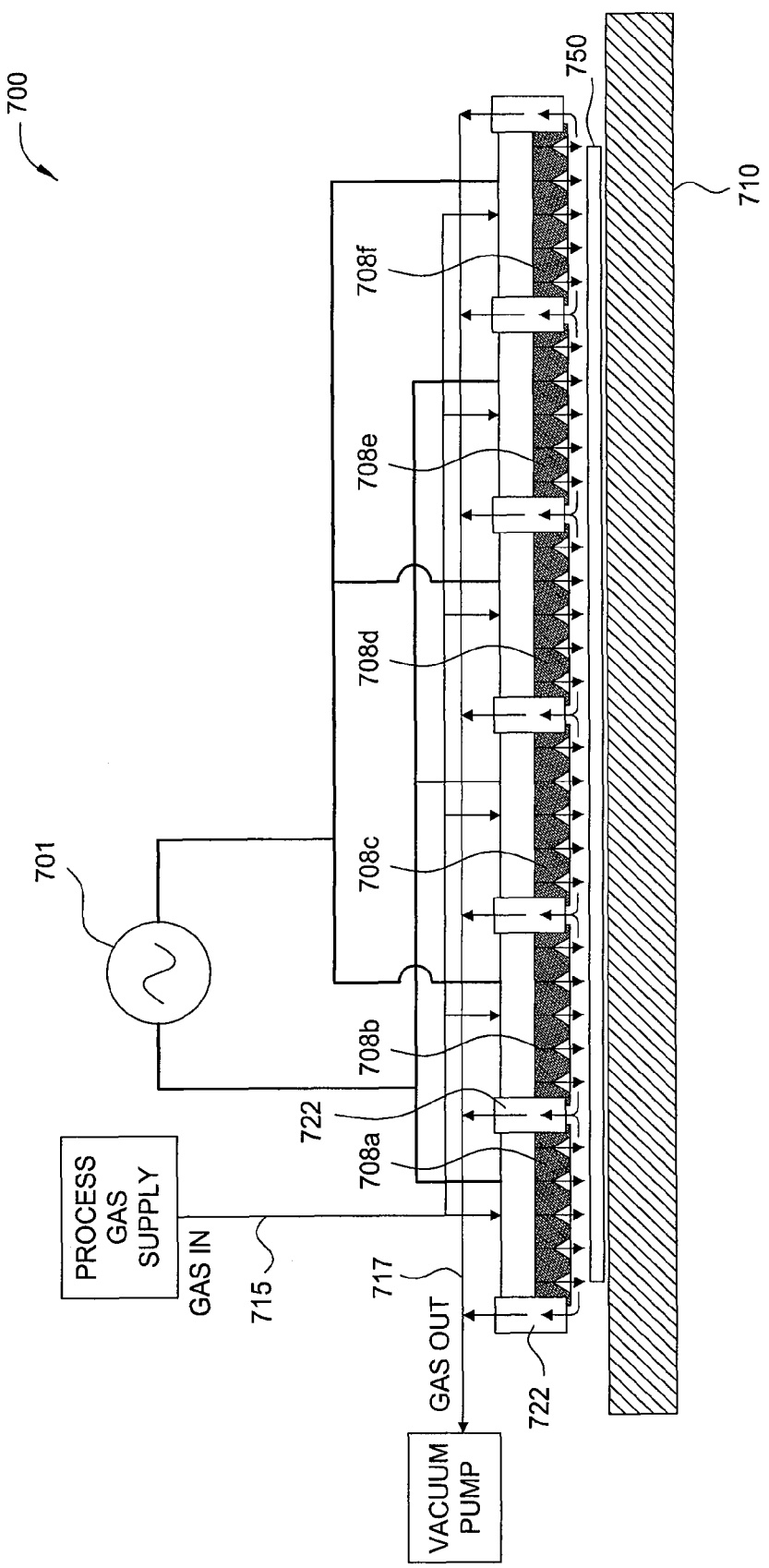
FIG. 7 is a schematic sectional view showing one embodiment of the gas flowing through a multi-electrode apparatus.

FIG. 7 is a schematic sectional view showing one embodiment of gas flowing through a multi-electrode apparatus. Plasma processing apparatus 700 is coupled to a chamber lid (not shown), which is disposed upon a chamber body (not shown). In the embodiment of FIG. 7, a plurality of electrodes 708a-f are present. Opposing the electrodes 708a-f, a substrate 750 is positioned on a susceptor 710. The susceptor 710 is a fixed susceptor coupled to the chamber body, and is capable of a supporting substrate 750. Alternatively, the susceptor 710 can support a flexible substrate, such as those used in roll-to-roll systems.

A substrate 750 is electrically floating on the susceptor 710, and plasma is capacitively-coupled to it through a differential RF power source 719. In the embodiment shown, the susceptor 710 is not coupled to the source 719, and therefore does not provide a return source path for the power source 719. Instead, the current travels through capacitively-coupled plasma to an out-of-phase electrode 708a-f.

RF power source 719 is coupled to electrodes 708a-f. The electrodes 708a-f are showerhead electrodes through which a process gas flows into the chamber, as depicted by the gas inlet path 715. Adjacent electrodes are powered out of phase from one another. For example, electrodes 708a, 708c and 708e are powered in one phase while the remaining electrodes 708b, 708d and 708f are powered in the opposite phase. Capacitively-coupled plasma is generated, and the process gas follows a laminar flow path across the surface of the substrate 750 and out of the chamber through members 722, acting as gas outlets. Current from RF power source 719 travels into the process chamber along electrodes in one phase (e.g., electrodes 708a, 708c and 708e), travels through the capacitively-coupled plasma, and is then back to the power source 719 through adjacent electrodes powered in the opposite phase (e.g., electrodes 708b, 708d and 708f).

Preferably, an equal amount of process gas enters through each electrode 708a-f into a region above the substrate 750. Alternatively, the amount of process gas entering individual electrodes 708a-f, or exiting the chamber through gas outlet members 722 can be varied to effect etching or deposition rates as process requirements dictate. For example, a greater amount of process gas may be flown into the chamber through the most outwardly-displaced electrodes 708a and 708f if necessary to create an even deposition of material on the substrate 750. The increased flow of process gas through electrodes 708a and 708f would allow etching or deposition rates near the periphery of a substrate 750 to be varied so that etching or deposition is uniform across the substrate 750. Similarly, gas flow through the outwardly-displaced electrodes 708a and 708f could also be less than that of the electrodes 708b-708e.

The electrodes 708a-f are electrically insulated from one another by gas outlet members 722, which allow gas flow therethrough. The gas outlet members 722 comprise a body defining a plenum. In the embodiment of FIG. 7, the body comprises an insulating material such as ceramic or quartz to electrically isolate adjacent electrodes 708a-f. The gas outlet members 722 are positioned between alternate electrodes 708a-f, and are coupled to the chamber lid as well as the electrodes 708a-f. The gas outlet members 722 are positioned in substantially the same plane as the electrodes 708a-f. The gas outlet members 722 have gas passages formed at least partially therethrough, and act as outlets for process gas within the system. The process gas exits the chamber through the gas outlet members 722 following gas flow path 717. Alternatively, the insulating blocks may be constructed of a solid insulating material. Process gas can enter the chamber through showerhead electrodes 708a-f, and exit the chamber following a path underneath and around electrodes 708a and 708f. In another embodiment, the gas may enter through the gas outlet members 722 and exit through the electrodes 708a-f.

Figure 8:
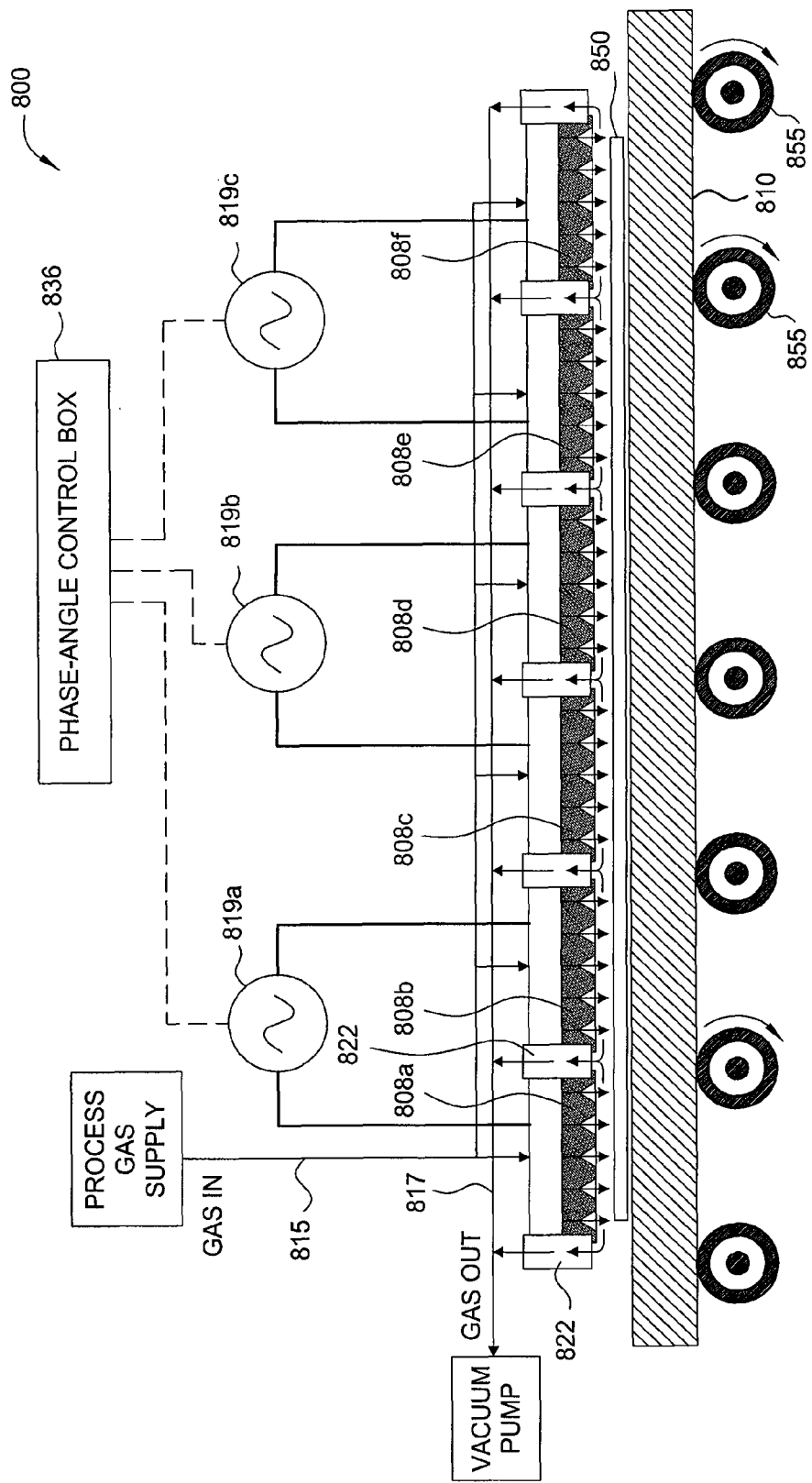
FIG. 8 is a schematic sectional view showing another embodiment of the gas flowing through a multi-electrode apparatus.

FIG. 8 is a schematic sectional view showing another embodiment of the gas flowing through a multi-electrode apparatus. Plasma processing apparatus 800 is coupled to a chamber lid (not shown), which is disposed upon a chamber body (not shown). In the embodiment of FIG. 8, a plurality of electrodes 808a-f are coupled to the chamber lid. Opposing electrodes 808a-f, a substrate 850 is positioned on a conductive susceptor 810. The susceptor 810 is a moving susceptor capable of rolling through the process region located underneath electrodes 808a-f. Susceptor 810 rolls on rollers 855 located beneath the susceptor 810. The current travels through capacitively-coupled plasma to an out-of-phase electrode 808a-f, which acts as a source return for the power supplies 819a-c.

Plasma processing apparatus 800 utilizes multiple RF power sources 819a-c coupled to a phase-angle control box 836 to power the electrodes 808a-f. The substrate 850 is positioned upon susceptor 810, and the susceptor 810 is moved past the electrodes 808a-f on rollers 855. The electrodes 808a-f are showerhead electrodes through which a process gas flows into the chamber, as depicted by the gas inlet path 815. Adjacent electrodes are powered out of phase from one another, such that electrodes 808a, 808c and 808e are powered in one phase, while electrodes 808b, 808d and 808f are powered in the opposite phase.

Capacitively-coupled plasma is generated within the chamber from a process gas while a substrate 850 is rolled past the electrodes 808a-f. The process gas follows a laminar flow path across the surface of a substrate 850 and out of the chamber through members 822, which act as gas outlets. Current from RF power sources 819a-c travels into the process chamber along electrodes in one phase (e.g., electrodes 808a, 808c and 808e), travels through the capacitively-coupled plasma, and is then returned to the sources 819a-c along adjacent electrodes powered in the opposite phase (e.g., electrodes 808b, 808d and 808f).

Preferably, an equal amount of process gas enters through each electrode 808a-f into a region above the substrate 850. Alternatively, the amount of process gas entering individual electrodes 808a-f, or exiting the chamber through individual gas outlet members 822 can be varied to effect etching or deposition rates as process requirements dictate. For example, a greater amount of process gas may be flown into the chamber through the most outwardly-displaced electrodes 808a and 808f if necessary to create an even deposition of material on the substrate 850. The increased flow of process gas through electrodes 808a and 808f would allow etching or deposition rates near the periphery of a substrate 850 to be varied so that etching or deposition is uniform across a substrate 850. Similarly, gas flow through the outwardly-displaced electrodes 808a and 808f could also be less than that of the electrodes 808b-808e. In another embodiment, the gas may enter through the gas outlet members 822 and exit the chamber through the electrodes 808a-f.

Electrodes 808a-f are electrically insulated from one another by gas outlet members 822, which allow gas flow therethrough. The gas outlet members 822 comprise a body defining a plenum. Preferably, the body comprises an insulating material such as ceramic or quartz. The gas outlet members 822 are positioned between alternate electrodes 808a-f, and are coupled to the chamber lid as well as the electrodes 808a-f. The gas outlets are positioned in substantially the same plane as the electrodes 808a-f. The gas outlet members 822 have gas passages formed therethrough, and act as outlets for process gas within the system. The process gas exits the chamber through the gas outlet members 822 following gas flow path 817. Alternatively, the insulating blocks may be constructed of a solid insulating material. Process gas can enter the chamber through showerhead electrodes 808a-f, and exit the chamber following a path underneath and around electrodes 808a and 808f.

A phase angle control box 836 is coupled to RF power sources 819a-c. The phase angle control box 836 allows for more variations in the phase arrangement of electrodes 808a-f. Preferably, electrodes 808a-f are powered such that adjacent electrodes are powered about 180 degrees out of phase. However, in an alternative embodiment, adjacent electrodes can be powered partially out of phase from one another, such as by 20 degrees, 50 degrees, or 70 degrees.

Figure 9:
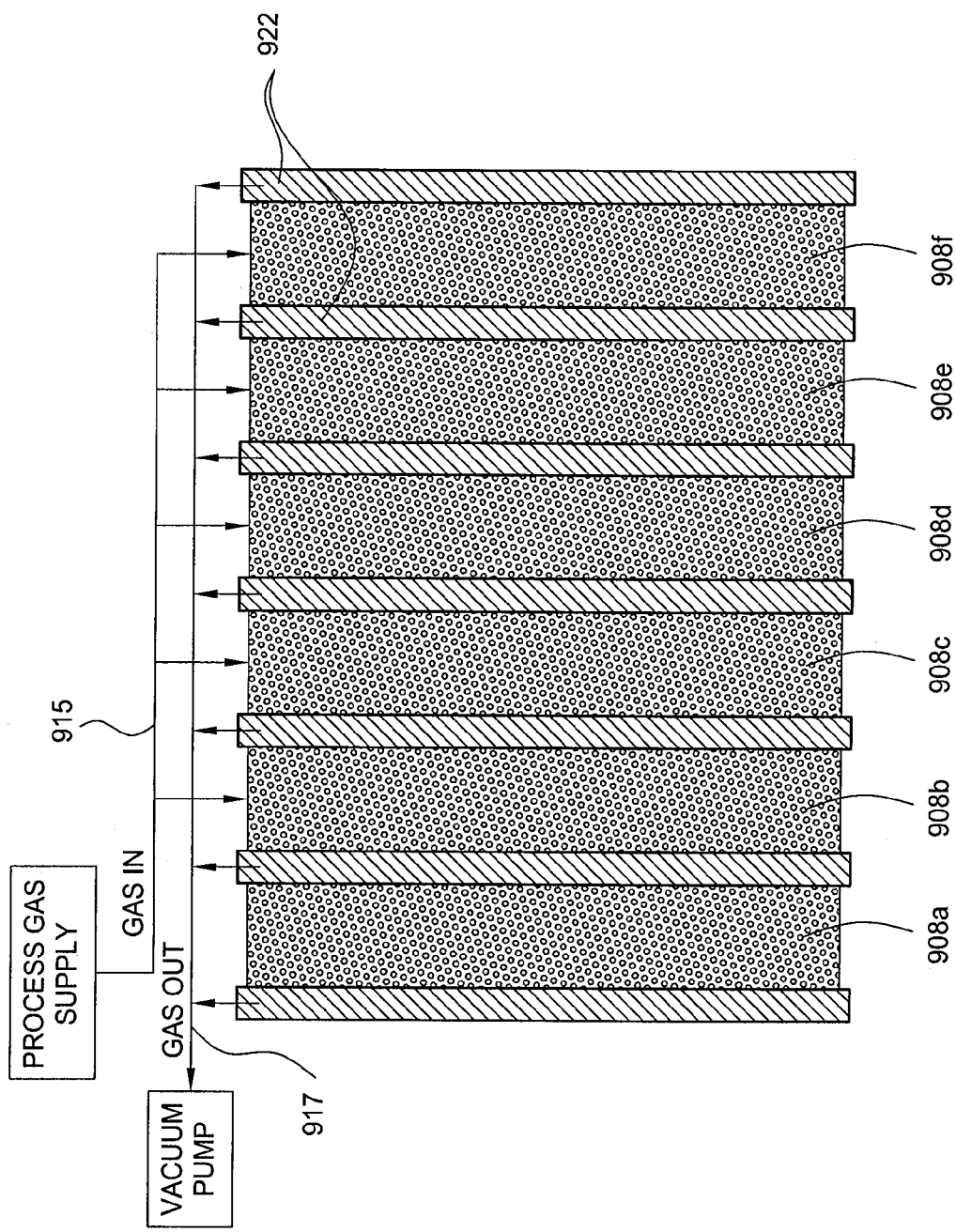
FIG. 9 is a bottom schematic view of another embodiment of a multi-electrode apparatus having gas distribution passages through the electrodes.

FIG. 9 is a bottom schematic view of another embodiment of a multi-electrode apparatus having gas distribution passages through the electrodes. FIG. 9 represents one embodiment of the electrode and gas outlet arrangements of a plasma processing apparatus. Process gas is exposed to a substrate (not shown) through showerhead electrodes 908a-f, and exits the chamber through members 922, which act as gas outlets. Gas outlet members 922 include an insulating body defining a plenum. The gas outlet members 922 have gas passages formed therethrough to permit the flow of the process gas out of the chamber. Preferably, the electrically insulating blocks have a vacuum pump coupled thereto to assist in evacuating the process gas from the chamber.

Alternatively, the flow of the process gas can be reversed. For example, the process gas can enter the chamber through the passages formed in member 922. The gas is evacuated from the chamber through electrodes 908a-f, which have openings formed at least partially therein. Preferably, electrodes 908a-f comprise showerhead electrodes having vacuum pumps coupled thereto, and the electrically insulating members have a process gas source coupled thereto.

In the embodiment of FIG. 9, the electrodes 908a-f are arranged such that adjacent electrodes are out of phase or about out of phase. For example electrodes 908a, 908c and 908e may be in one phase, while electrodes 908b, 908d and 908f may be in the opposite phase. A substrate is moved past electrodes 908a-f on a moving susceptor (not shown), while electrodes 908a-f are biased by an RF power source (not shown). In an alternative embodiment, the susceptor is static.

In yet another alternative embodiment, there is no susceptor, and the substrate is capacitively coupled to electrodes 908a-f through capacitively-coupled plasma. Capacitively-coupled plasma is generated within the chamber from a process gas. The process gas follows a laminar flow path across the surface of a substrate and out of the chamber through gas outlet members 922. Current from an RF power source travels into the process chamber through electrodes in one phase (e.g., electrodes 908a, 908c and 908e), travels through the capacitively-coupled plasma, and is then removed from the chamber through adjacent electrodes powered in the opposite phase (e.g., electrodes 908b, 908d and 908f).

Figure 10:
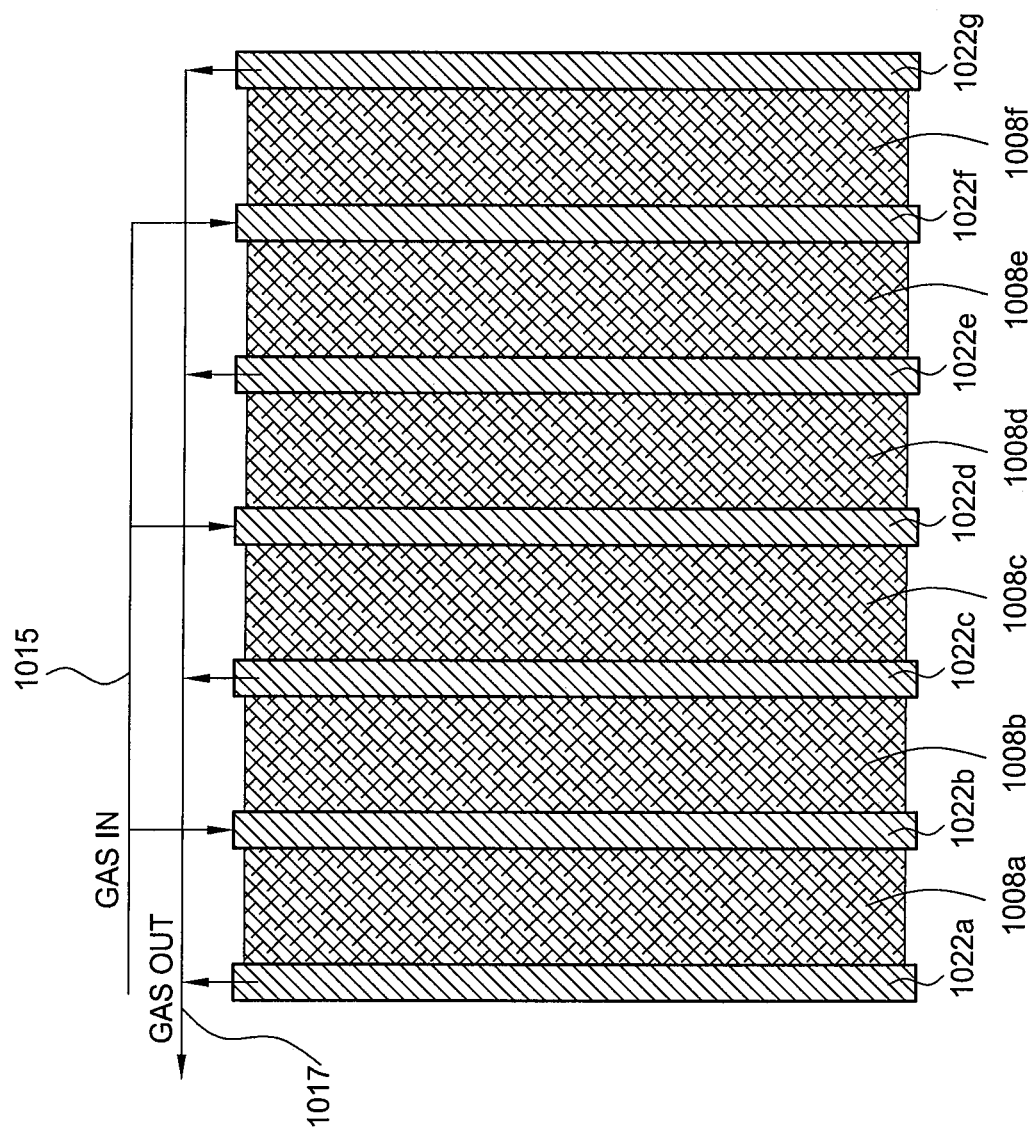
FIG. 10 is a bottom schematic view of another embodiment of a multi-electrode apparatus.

FIG. 10 is a bottom view schematic of another embodiment of a multi-electrode apparatus. FIG. 10 represents another embodiment of the electrode and gas outlet arrangements of a plasma processing apparatus. In the embodiment of FIG. 10, electrodes 1008a-f are alternately separated be either gas inlet members or gas outlet members 1022a-g. For example, electrodes 1008a and 1008b are separated from one another by gas inlet member 1022b. Additionally, electrodes 1008b and 1008c are separated by gas outlet member 1022c. Gas inlet members 1022b, 1022d and 1022f, and gas outlets members 1022a, 1022c, 1022e and 1022g are used in this fashion to separate electrodes 1008a-f.

Electrodes 1008a-f are powered in an out of phase arrangement, such that adjacent electrodes are out of phase or about out of phase from one another. For example, electrodes 1008a, 1008c and 1008e are powered in one phase, while electrodes 1008b, 1008d and 1008f are powered in the opposite phase. The electrodes are powered by an RF power source (not shown).

Gas inlet members 1022b, 1022d and 1022f, and gas outlet members 1022a, 1022c, 1022e and 1022g comprise electrically insulating members having gas passages disposed therethrough. The gas outlet and gas inlet members 1022a-g are coupled to either a vacuum pump or a process gas supply source, respectively. Process gas is exposed to a substrate (not shown) through electrically insulating members 1022b, 1022d and 1022f, which act as gas inlets and have a process gas supply source coupled thereto. Gas inlet members 1022b, 1022d and 1022f comprise an insulating body defining a plenum. Process gas enters the process region following flow path 1015.

Process gas is removed from the processing chamber through electrically insulating bodies 1022a, 1022c, 1022e and 1022g which act as gas outlets. Gas outlets 1022a, 1022c, 1022e and 1022g are preferably similar in size and construction as gas inlets 1022b, 1022d and 1022f. Process gas exiting the process region follows a flow path 1017. A vacuum pump may be coupled to gas outlets 1022a, 1022c, 1022e and 1022g to help facilitate removal of process gas from the chamber.

The following examples are illustrative of plasma properties generated by some embodiments of the present invention. The examples are provided for illustrative purposes, and are not meant to be limiting in scope.

Example 1

Plasma generated in spacing of plasma processing apparatus 100 from Argon plasma at 2 Torr and 500K. A RF power source at 40 MHz supplied 0.05 watts per square centimeter to two electrodes of 2350 square centimeters each.

| PARAMETER | VALUE |
| --- | --- |
| Neutral Gas Density | $3.9 \times 10^{16}$ cm$^{-3}$ |
| Bulk Plasma Density | $6.9 \times 10^{10}$ cm$^{-3}$ |
| Electron Temperature | 1.5 eV |
| Ion Temperature | 0.04 eV |
| Excitation Frequency | $2.5 \times 10^{8}$ rad/s |
| Electron Plasma Frequency | $1.5 \times 10^{10}$ rad/s |
| Electron-Neutral Collision | $5.3 \times 10^{9}$ s$^{-1}$ |
| Stochastic-Heating Collision Frequency | $1 \times 10^{6}$ s$^{-1}$ |

-continued

| PARAMETER | VALUE |
| --- | --- |
| Electron Effective Collision Frequency | $5.3 \times 10^{9}$ s$^{-1}$ |
| Electron Thermal Velocity | $5.1 \times 10^{7}$ cm/s |
| Ion Thermal Velocity | $3.2 \times 10^{4}$ cm/s |
| Bohm Velocity | $1.9 \times 10^{5}$ cm/s |
| Electron-Neutral Mean Free Path | $9.6 \times 10^{-3}$ cm |
| Ion-Neutral Mean Free Path | $2.6 \times 10^{-3}$ cm |
| Debye Length | $1.5 \times 10^{-3}$ cm |
| Skin Depth | 13 cm |

Example 2

Plasma generated in spacing of plasma processing apparatus 300 from Argon plasma at 9 Torr and 500K. A RF power source at 40 MHz supplied 0.5 watts per square centimeter to two electrodes of 2350 square centimeters.

| PARAMETER | VALUE |
| --- | --- |
| Neutral Gas Density | $1.7 \times 10^{17}$ cm$^{-3}$ |
| Bulk Plasma Density | $8 \times 10^{11}$ cm$^{-3}$ |
| Electron Temperature | 1.3 eV |
| Ion Temperature | 0.04 eV |
| Excitation Frequency | $2.5 \times 10^{8}$ rad/s |
| Electron Plasma Frequency | $5 \times 10^{10}$ rad/s |
| Electron-Neutral Collision | $2.4 \times 10^{10}$ s$^{-1}$ |
| Stochastic-Heating Collision Frequency | $1.5 \times 10^{6}$ s$^{-1}$ |
| Electron Effective Collision Frequency | $2.4 \times 10^{10}$ s$^{-1}$ |
| Electron Thermal Velocity | $4.8 \times 10^{7}$ cm/s |
| Ion Thermal Velocity | $3.1 \times 10^{4}$ cm/s |
| Bohm Velocity | $1.8 \times 10^{5}$ cm/s |
| Electron-Neutral Mean Free Path | $2 \times 10^{-3}$ cm |
| Ion-Neutral Mean Free Path | $5.8 \times 10^{-4}$ cm |
| Debye Length | $1 \times 10^{-3}$ cm |
| Skin Depth | 13 cm |

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
 a chamber;
 a plurality of electrodes disposed in the chamber;
 an RF power source coupled to the plurality of electrodes such that adjacent electrodes are driven out of phase with each other;
 a first matchbox consisting of a load capacitor and a tuning capacitor, the first matchbox coupled to the RF power source;
 a second matchbox consisting of two capacitors and an inductor positioned therebetween, the second matchbox coupled to the plurality of electrodes and the tuning capacitor of the first matchbox;
 a susceptor disposed opposite the plurality of electrodes; and
 at least one electrically insulating member coupled between adjacent electrodes and electrically isolating the adjacent electrodes, the at least one electrically insulating member having a plenum formed at least partially therein and at least one opening facing the susceptor, the at least one electrically insulating member having a length greater than a width.

2. The apparatus of claim 1, wherein at least one of the plurality of electrodes has one or more gas passages formed therethrough.

3. The apparatus of claim 2, further comprising a vacuum pump coupled with the at least one electrically insulating member.

4. The apparatus of claim 1, further comprising a vacuum pump coupled with a first member of the at least one electrically insulating members.

5. The apparatus of claim 2, further comprising a gas source coupled with a second electrically insulating member.

6. The apparatus of claim 1, further comprising rollers positioned beneath the susceptor capable of moving the susceptor linearly past the plurality of electrodes.

7. The apparatus of claim 1, further comprising one or more brackets electrically coupled with the susceptor and the power source.

8. The apparatus of claim 1, further comprising one or more glass plates coupled with each electrode and disposed between each electrode and the susceptor.

9. The apparatus of claim 1, further comprising one or more capacitors coupled to each electrode.

10. The apparatus of claim 9, further comprising one or more inductors coupled between adjacent capacitors.

11. The apparatus of claim 1, wherein the load capacitor provides a constant power level from the RF power source to the electrodes and the tuning capacitor matches impedance or sets the resonance frequency in the second matchbox.

\* \* \* \* \*